United States Patent [19]
Taniguchi et al.

[11] Patent Number: 6,150,904
[45] Date of Patent: Nov. 21, 2000

[54] SURFACE ACOUSTIC WAVE FILTER HAVING REFERENCE POTENTIAL PACKAGE ELECTRODE LANDS WHICH ARE ELECTRICALLY ISOLATED

[75] Inventors: Norio Taniguchi; Tadamasa Ushiroku, both of Ishikawa-ken, Japan

[73] Assignee: Murata Manufacturing Co., Ltd., Japan

[21] Appl. No.: 09/000,592

[22] Filed: Dec. 30, 1997

[30] Foreign Application Priority Data

Jan. 10, 1997 [JP] Japan ................................. 9-002527

[51] Int. Cl.$^7$ ..................................................... H03H 9/64
[52] U.S. Cl. ...................... 333/193; 333/195; 310/313 B
[58] Field of Search .................................. 333/193–196; 310/313 R, 313 B, 313 C, 313 D

[56] References Cited

U.S. PATENT DOCUMENTS

| | | | |
|---|---|---|---|
| 5,506,552 | 4/1996 | Seki et al. | 333/194 X |
| 5,559,481 | 9/1996 | Satoh et al. | 333/193 |
| 5,682,126 | 10/1997 | Plesski et al. | 333/193 |
| 5,905,418 | 5/1999 | Ehara et al. | 333/133 X |
| 5,945,893 | 8/1999 | Plessky et al. | 333/195 |

FOREIGN PATENT DOCUMENTS

| | | | |
|---|---|---|---|
| 0 740 411 A1 | 10/1996 | European Pat. Off. | 333/193 |
| 56-19765 | 5/1981 | Japan . | |
| 7-154201 | 6/1995 | Japan | 333/194 |
| 7-264000 | 10/1995 | Japan | 333/194 |
| 10-117121 | 5/1998 | Japan . | |

OTHER PUBLICATIONS

Patent Abstracts of Japan, JP 07–176979 dated Jul. 14, 1995.
Patent Abstracts of Japan, JP 07–273597 dated Oct. 20, 1995.
Y. Satoh et al., "A Ladder Filter Using One–Port SAW Resonators", *Technical Report of the Institute of Electronics, Information and Communication Engineers*, US95–25, EMD95–21, CPM95–33 (Jul. 1995).

*Primary Examiner*—Benny Lee
*Assistant Examiner*—Barbara Summons
*Attorney, Agent, or Firm*—Keating & Bennett LLP

[57] ABSTRACT

A surface acoustic wave filter includes a surface acoustic wave filter element and a package for holding the surface acoustic wave filter element. The surface acoustic wave filter element includes a plurality of series arm resonators and first, second and third parallel arm resonators each disposed on a piezoelectric substrate so as to define a ladder-type circuit. The first and second parallel arm resonators are close to input and output terminals of the filter element, respectively. Reference potential electrodes of the first and second parallel arm resonators are electrically connected to first and second electrode lands which are provided on the package and electrically isolated from each other while a reference potential electrode of the third parallel arm resonator is short-circuited with the reference potential electrode of either the first or second parallel arm resonator within the package.

10 Claims, 19 Drawing Sheets

SURFACE ACOUSTIC WAVE FILTER HAVING REFERENCE POTENTIAL PACKAGE ELECTRODE LANDS WHICH ARE ELECTRICALLY ISOLATED

BACKGROUND OF THE INVENTION

1. Field of the Invention

The present invention relates to a surface acoustic wave filter comprising a plurality of SAW (Surface Acoustic Wave) resonators disposed on a piezoelectric substrate. More particularly, the present invention relates to a surface acoustic wave filter in which a plurality of SAW resonators define a ladder-type filter circuit.

2. Description of the Related Art

A conventional surface acoustic wave filter comprising a plurality of SAW resonators disposed on a piezoelectric substrate has been used as a high frequency band filter for a mobile communication device. Japanese Patent Publication (Kokoku) No. 56-19765 discloses a surface acoustic wave filter in which a plurality of SAW resonators define a ladder type circuit on a piezoelectric substrate.

In the above-mentioned surface acoustic wave filter, the resonance frequency fr of a series arm resonator, which forms a ladder-type circuit, is arranged to coincide with the anti-resonance frequency fa of a parallel arm resonator to which parallel arms are inserted so that the input/output impedance is equal to the characteristic impedance near the coincident frequency, thus forming a pass band. An example of the attenuation frequency characteristic of this type of surface acoustic wave filter is shown in FIG. 21.

Since the above-explained surface acoustic wave filter is used as a band pass filter, there has been a strong demand for increasing the attenuation amount in frequency regions other than the pass band. It is known that in order to increase the attenuation amount in the frequency region near the pass band, the electrostatic capacitance of the parallel arm resonator should preferably be increased relative to the electrostatic capacitance of the series arm resonator (Technical Report of the Institute of Electronics, Information and Communication Engineers, US95-25, pp.39–46, July 1995).

However, in the surface acoustic wave filter having a ladder-type circuit, if the capacitance ratio of the parallel arm resonator relative to the series arm resonator is varied, this causes an increase in insertion loss. More specifically, FIG. 22 shows the attenuation frequency characteristic when the ratio of the electrostatic capacitance of the parallel arm resonator to that of the series arm resonator is varied in the surface acoustic wave filter having a ladder-type circuit. In FIG. 22, the characteristics denoted as A to C are obtained by using surface acoustic wave filters A to C having a ladder-type circuit in which the parallel arm resonator has increasing amounts of capacitance in ascending order of A to C.

As is clear from the solid lines A to C, when the electrostatic capacitance of the parallel arm resonator is increased, the insertion loss within the pass band increases although the attenuation amount near the pass band increases.

That is, since the attenuation amount and the insertion loss in the frequency region near the pass band have a direct proportional relationship, it is impossible to increase only the attenuation amount in the frequency region near the pass band without increasing the insertion loss by merely changing the electrostatic capacitance ratio.

Accordingly, there has been a demand for a surface acoustic wave filter capable of increasing the attenuation amount in the frequency region near the pass band without increasing the insertion loss.

SUMMARY OF THE INVENTION

The present invention is directed to a surface acoustic wave filter which overcomes the above-described problems of the prior art and provides a surface acoustic wave filter which significantly increases an attenuation amount in a frequency region near the pass band without increasing the insertion loss.

The surface acoustic wave filter according to preferred embodiments of the present invention comprises a surface acoustic wave element and a package containing the surface acoustic wave element. The surface acoustic wave filter element includes series arm resonators and parallel arm resonators disposed on a piezoelectric substrate so as to define a ladder-type circuit which has a series arm having input and output terminals and a plurality of parallel arms located between the series arm and a reference potential. The package holds the surface acoustic wave filter element therein and has a plurality of electrode lands connected to the surface acoustic wave filter element. A plurality of bonding wires connect the input and output terminals and a reference potential terminal of the surface acoustic wave filter element to the plurality of electrode lands of the package, respectively. A first one of the parallel arm resonators is connected between the reference potential and a connection point between the input terminal and one of the series arm resonators which is closest to the input terminal, and a second one of the parallel arm resonators is connected between the reference potential and a connection point between the output terminal and one of the series arm resonators which is closest to the output terminal. Reference potential electrodes of the first and second parallel arm resonators are connected to first and second ones of the electrode lands which are provided in the package and which are electrically insulated from each other, respectively, and a reference potential electrode of another one of the parallel arm resonators is short-circuited with the reference potential electrode of the first or second parallel arm resonator within the package.

As described above, by arranging the reference potential electrode of the parallel arm resonator, which is neither the first nor second parallel arm resonator, to be short-circuited with the reference potential electrode of the first or second parallel arm resonator within the package, as is clear from the preferred embodiments of the invention to be described later, it is possible to remarkably and significantly increase the attenuation amount in the frequency region near the pass band without increasing the insertion loss. That is, an important feature of the present invention is that the attenuation amount in the frequency region near the pass band is improved without the insertion loss being increased by devising a novel method of connecting reference potential electrodes. This method has not been previously considered or recognized.

In an aspect in which the reference potential electrode of the parallel arm resonator which is neither the first nor second parallel arm resonator is short-circuited with the reference potential electrode of the first or second parallel arm resonator within the package, various constructions may be adopted.

That is, the reference potential electrode of the parallel arm resonator which is neither the first nor second parallel arm resonator is connected preferably by a bonding wire to the first or second electrode land to which the reference potential electrode of the first or second parallel arm resonator is connected.

Further, the reference potential electrode of the parallel arm resonator which is neither the first nor second parallel arm resonator is electrically short-circuited with the reference potential electrode of the first or second parallel arm resonator on a piezoelectric substrate.

Further, the reference potential electrode of the parallel arm resonator which is neither the first nor second parallel arm resonator is connected preferably by a bonding wire to the first or second electrode land which is short-circuited within the package.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
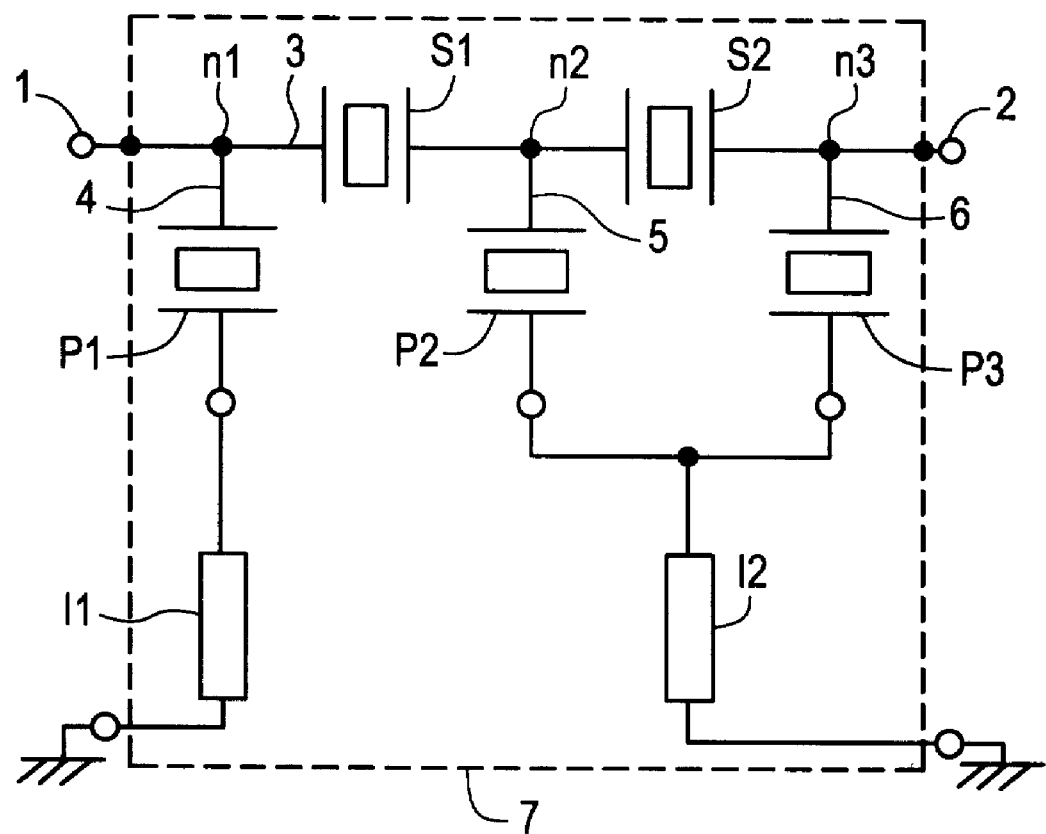
FIG. 1 shows an equivalent circuit of a surface acoustic wave filter according to a first preferred embodiment of the present invention.

FIG. 1 is a circuit diagram of a first preferred embodiment of a surface acoustic wave filter according to the present invention. As shown in FIG. 1, a series arm 3 is provided between an input terminal 1 and an output terminal 2, and parallel arms 4, 5 and 6 are connected between the series arm 3 and a ground potential.

Series arm resonators S1 and S2 are inserted in series into the series arm 3. The parallel arm 4 is connected between the reference potential and the connection point n1 of the input terminal 1 and the series arm resonator S1, with a parallel arm resonator P1 inserted into the parallel arm 4. The parallel arm 5 is connected between the reference potential and the connection point n2 of the series arm resonators S1 and S2, with a parallel arm resonator P2 inserted into the parallel arm 5. The parallel arm 6 is connected between the reference potential and the connection point n3 of the series arm resonator S2 and the output terminal 2, with a parallel arm resonator P3 inserted into the parallel arm 6.

Dotted line 7 indicates a package, which will be described later. The resonators Si and S2, and P1 to P3 form a ladder-type circuit within the package 7. Each of the resonators Si and S2, and P1 to P3 is preferably a one-port-type SAW resonator.

The reference potential electrode of the parallel arm resonator P1 is connected to the reference potential via an impedance I1, and the reference potential electrodes of the parallel arm resonators P2 and P3 are short-circuited within the package 7 and further connected to the reference potential via an impedance I2 of the package 7. The impedances I1 and I2 are caused by inductances and parasitic capacitances of bonding wires and package wirings. In the above-described construction, the parallel arm resonator P1 forms a first parallel arm resonator in the present invention, the parallel arm resonator P3 forms a second parallel arm resonator, and the parallel arm resonator P2 forms a parallel arm resonator other than the first and second parallel arm resonators.

Therefore, the reference potential electrode of the first parallel arm resonator P1 and the reference potential electrode of the second parallel arm resonator P3 are individually wired within the package 7, and the reference potential electrode of the parallel arm resonator P2 is electrically short-circuited with the reference potential electrode of the second parallel arm resonator P3 within the package 7.

Figure 2:
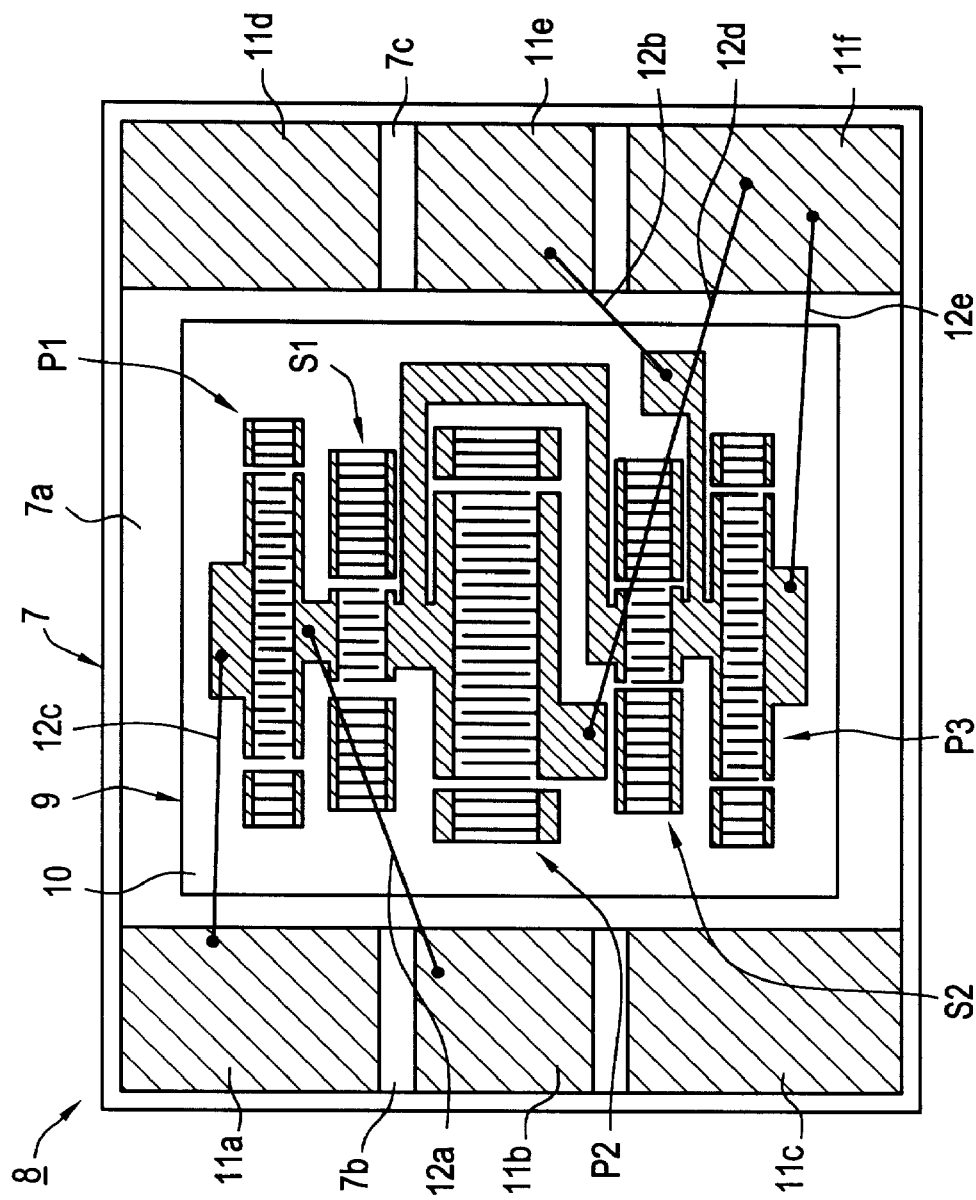
FIG. 2 is a plan view illustrating the surface acoustic wave filter according to the first preferred embodiment.

The surface acoustic wave filter of this preferred embodiment having the circuit components shown in FIG. 1 is shown in the plan view of FIG. 2 in which a lid member of the package 7 is removed. Referring to FIG. 2, a surface acoustic wave filter 8 is formed using the package 7 preferably comprising a laminated ceramic package. The package 7 may be formed of insulating materials other than a laminated ceramic package.

The package 7 has an opening 7a, and a SAW filter element 9 is fixed within the opening 7a. The SAW filter element 9 includes a piezoelectric substrate 10.

The piezoelectric substrate 10 may be formed of a piezoelectric single crystal, such as $LiNbO_3$, $LiTaO_3$ or quartz, or a piezoelectric ceramic, such as a lead zirconate titanate-type piezoelectric ceramic. In place of the piezoelectric substrate 10, a substrate having a piezoelectric thin film, such as an insulating substrate having a ZnO thin film thereon may be used. In the case where a piezoelectric substrate having a piezoelectric thin film formed on an insulating substrate is used, electrodes of the SAW resonator and the like, which will be described later, may be formed on either the top surface or the bottom surface of the piezoelectric thin film (i.e., between the piezoelectric thin film and the insulating substrate).

The series arm resonators S1 and S2 and the parallel arm resonators P1 to P3 are arranged on the piezoelectric substrate 10 so as to define a ladder-type circuit shown in FIG. 1.

Each of the series arm resonators S1 and S2 and the parallel arm resonators P1 to P3 preferably comprises a oneport-type SAW resonator such that reflectors are provided on both sides of an interdigital electrode (hereinafter referred to as an "ID electrode") preferably comprising a pair of comb electrodes.

Further, step sections 7b and 7c are located on both sides of the opening 7a of the package 7. The step sections 7b and 7c are located higher than the bottom of the opening 7a, and electrode lands 11a to 11c, and electrode lands 11d to 11f are disposed on the step sections 7b and 7c, respectively. The electrode lands 11a to 11c and 11d to 11f are formed of, for example, a conductive film made of Al, Cu or an alloy thereof.

The electrode land 11b is connected to the input terminal 1 shown in FIG. 1, and the electrode land 11e is connected to the input terminal 2. More specifically, one comb electrode of the ID electrode of the series arm resonator S1 is connected to the electrode land 11b by a bending wire 12a, and the other comb electrode of the ID electrode of the series arm resonator S1 is connected to one comb electrode of the ID electrode of the series arm resonator S2. The other comb electrode of the series arm resonator S2 is connected to the electrode land 11e by bonding wire 12b.

The comb electrode on the hot side of the ID electrode of the parallel arm resonator P1 is connected to the series arm resonator S1, and the comb electrode on the grounding side is connected to the electrode land 11a by bonding wire 12c. Further, the comb electrode on the hot side of the ID electrode of the parallel arm resonator P2 is electrically connected to the comb electrode of the series arm resonator S1, and the comb electrode on the grounding side of the parallel arm resonator P2 is connected to the electrode land 11f by bonding wire 12d. The comb electrode on the hot side of the second parallel arm resonator P3 is connected to one comb electrode of the ID electrode of the series arm resonator S2, and the comb electrode on the grounding side of the ID electrode of the parallel arm resonator P3 is connected to the electrode land 11f by bonding wire 12e.

The electrode lands 11a, 11c, 11d and 11f are connected to the ground potential outside the package 7. Within the package 7, as described above, the first parallel arm resonator P1 is connected to the electrode land 11a, and the second parallel arm resonator P3 is connected to the electrode land 11f. That is, the reference potential electrodes of the first and second parallel arm resonators P1 and P3 are connected to different electrode lands 11a and 11f. Further, the reference potential electrode of the parallel arm resonator P2 other than the first and second parallel arm resonators is short-circuited with the reference potential electrode of the second parallel arm resonator P3 via the electrode land 11f.

The construction for electrically connecting the electrode lands 11a to 11f to outside the package 7 will be described below with reference to FIGS. 3 and 4.

Figure 3:
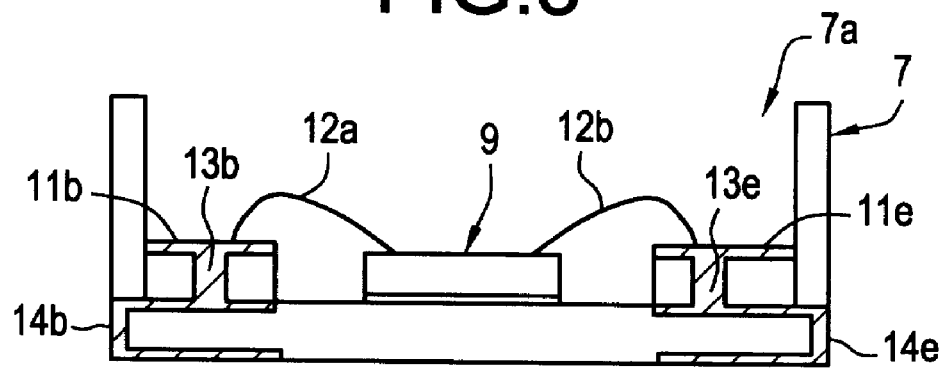
FIG. 3 is a cross-sectional view of the surface acoustic wave filter shown in FIG. 2.

As shown in the cross-sectional view of FIG. 3, in the package 7, for example, the electrode lands 11b and 11e are electrically connected to external electrodes 14b and 14e via through holes 13b and 13e, respectively. The external electrodes 14b and 14e are provided on the bottom surface of the package 7 and used as electrodes for connection with an external source.

Figure 4:
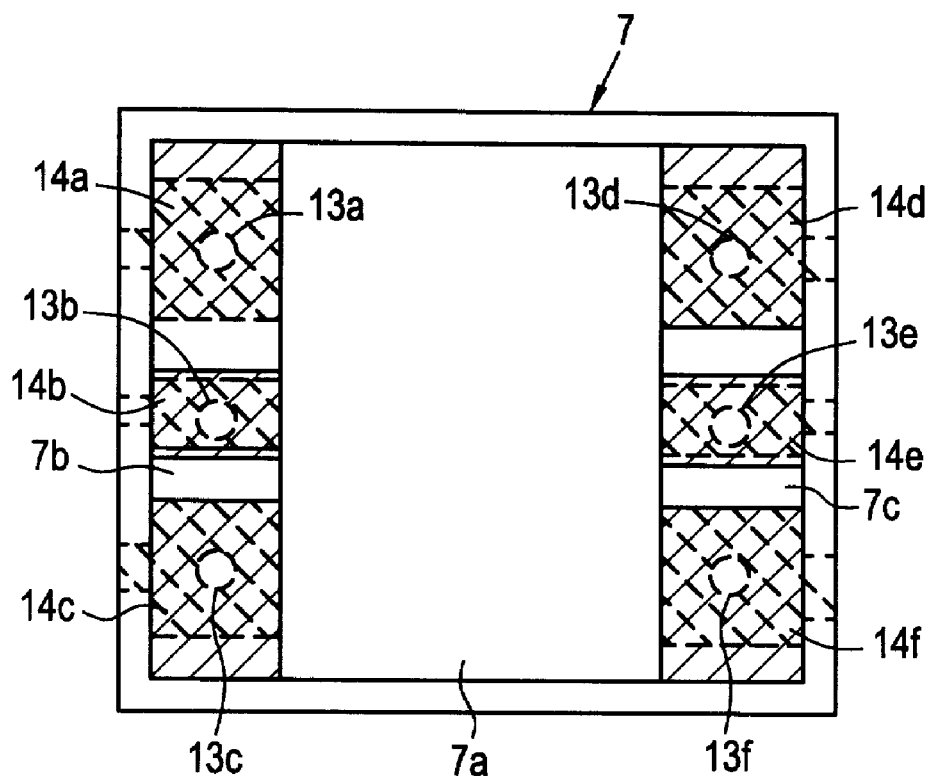
FIG. 4 is a plan view illustrating external electrodes formed in a package used in the first preferred embodiment.

FIG. 4 shows a plan view of the step portions 7b and 7c of the package 7, in a state in which the surface acoustic wave filter element 9 is not inserted. On the step sections 7b and 7c on both sides of the opening 7a, the electrode lands 11a to 11f are arranged as shown in FIG. 2. The electrode lands 11a to 11f are illustrated with solid hatching lines in FIG. 4 while the external electrodes 14a to 14f positioned below the step sections 7b and 7c are shown with dotted hatching lines. The external electrodes 14a, 14c, 14d and 14f are electrically connected to the electrode lands 11a 11c, 11d and 11f on the top surface via the through holes 13a, 13c, 13d and 13f similarly to the external electrodes 14a and 14b shown in FIG. 3. The external electrodes 14a, 14c, 14d and 14f also extend onto the bottom surface through the side surfaces of the package 7.

In the surface acoustic wave filter 8 of this preferred embodiment, as described above, the first and second parallel arm resonators P1 and P3 are electrically connected to the first and second electrode lands 11a and 11f which are different electrode lands, and the reference potential electrode of the second parallel arm resonator P3 is electrically connected to the second electrode land 11f. Therefore, it is possible to greatly improve the attenuation amount in the frequency region near the pass band, in particular, in the frequency region lower than the pass band, without causing insertion loss to increase. This will be explained below by contrasting the preferred embodiments of the present invention with Comparative example 1 described in FIGS. 5 to 7 and Comparative example 2 described in FIGS. 8 and 9.

Figure 5:
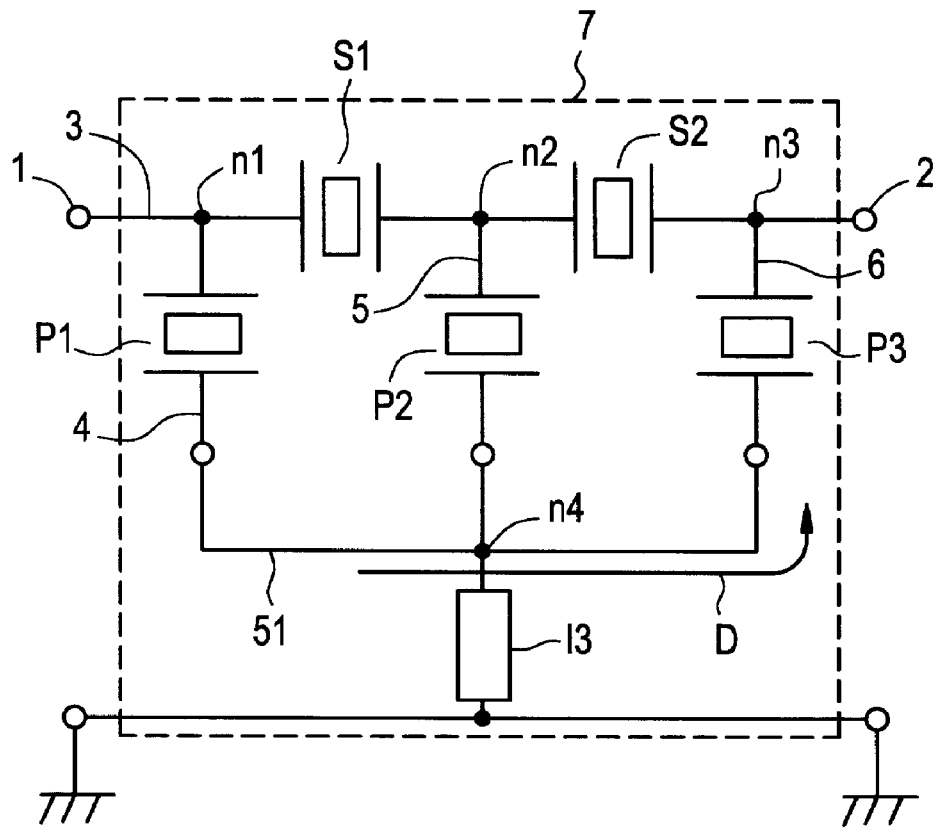
FIG. 5 is a circuit diagram of a surface acoustic wave filter of Comparative example 1.

In electronic components, such as surface acoustic wave filter elements, it is common practice that all electrodes connected to a ground potential are short-circuited within a package. For example, in the surface acoustic wave filter of the first preferred embodiment, when all electrodes to be connected to the reference potential electrode are short-circuited within the package, the circuit diagram is as shown in FIG. 5. Components in FIG. 5 which are the same as those of FIG. 1 are given the same reference numerals.

As is clear from FIG. 5, all of the ground electrodes of the first, second and third parallel arm resonators P1, P2 and P3 are connected at a common connection point n4 within the package 7. An impedance I3 indicates an impedance in the package 7. That is, the reference potential electrodes of the parallel arm resonators P1 to P3 are short-circuited within the package 7, and then connected to the grounding potential via the impedance I3.

In the equivalent circuit shown in FIG. 5, a signal input from inside the input terminal leaks to the output terminal 2 side via a line 51 as indicated by an arrow D. In particular, at the resonance point of the parallel arm resonators P1 to P3, namely, in the low frequencies of the pass band, since the impedance of these parallel arm resonators P1 to P3 decreases, the influence of the impedance I3 on the package side becomes large, and the tendency of leakage of the signal becomes noticeable. For this reason, the attenuation in the frequency region lower than the pass band decreases.

Figure 6:
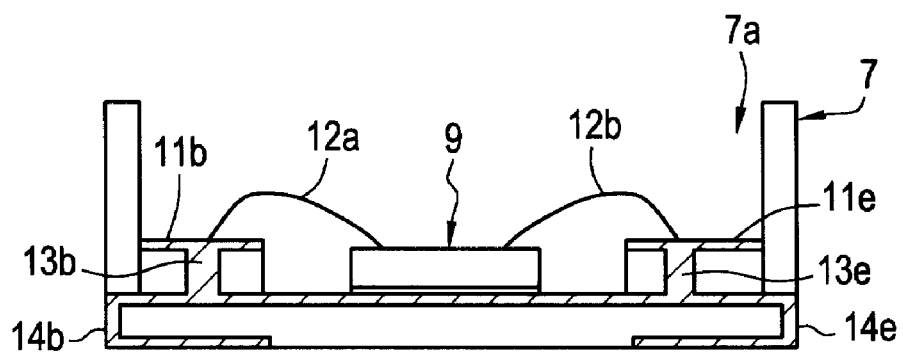
FIG. 6 is a cross-sectional view of the surface acoustic wave filter of Comparative example 1.
Figure 7:
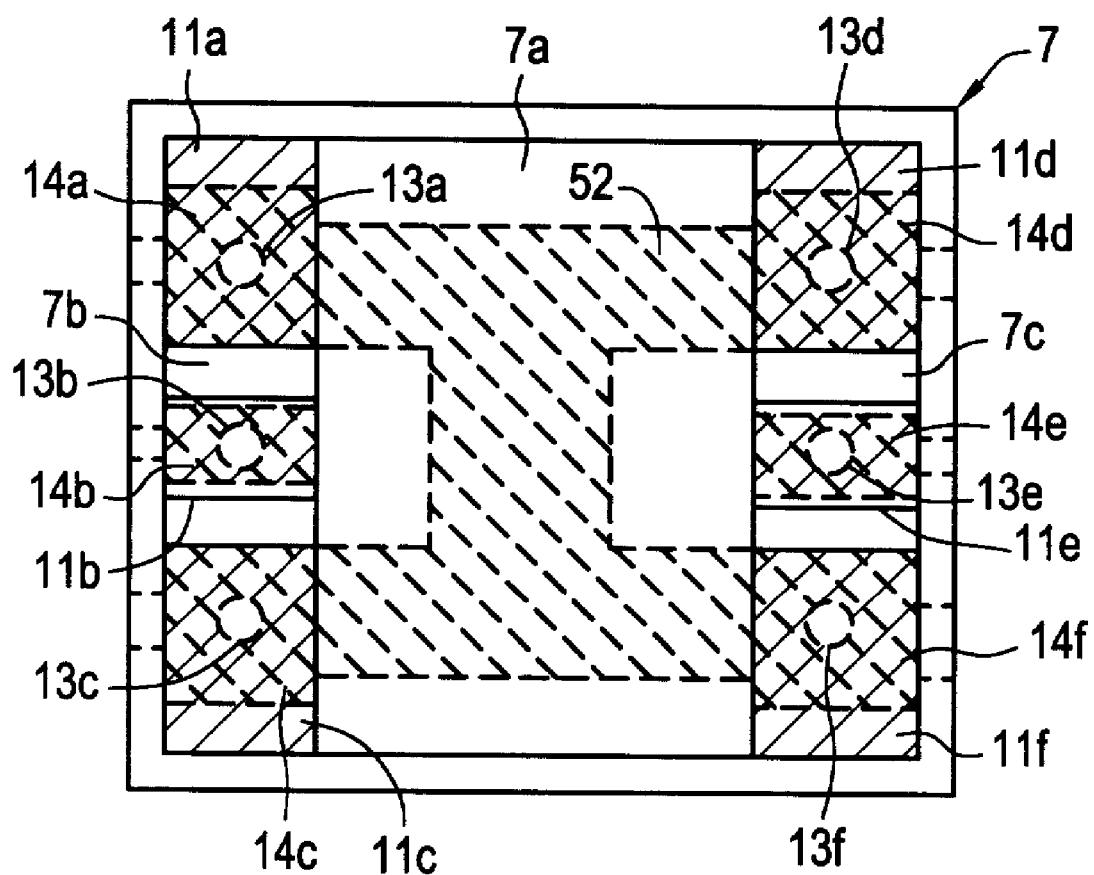
FIG. 7 is a plan view illustrating conductive patterns within a package in the surface acoustic wave filter of Comparative example 1.

The configuration of electrode lands provided in the package 7 in the comparative example 1 is shown in the sectional view of FIG. 6 and the plan view of FIG. 7. FIGS. 6 and 7 correspond to FIGS. 3 and 4 which show the package of the surface acoustic wave filter of the first preferred embodiment.

As is clear from FIG. 7, the external electrodes 14a to 14f connected to the electrode lands 11a to 11f which are connected to the grounding potential via the through holes 13f to 13f are connected in common by a conductive pattern 52.

Figure 8:
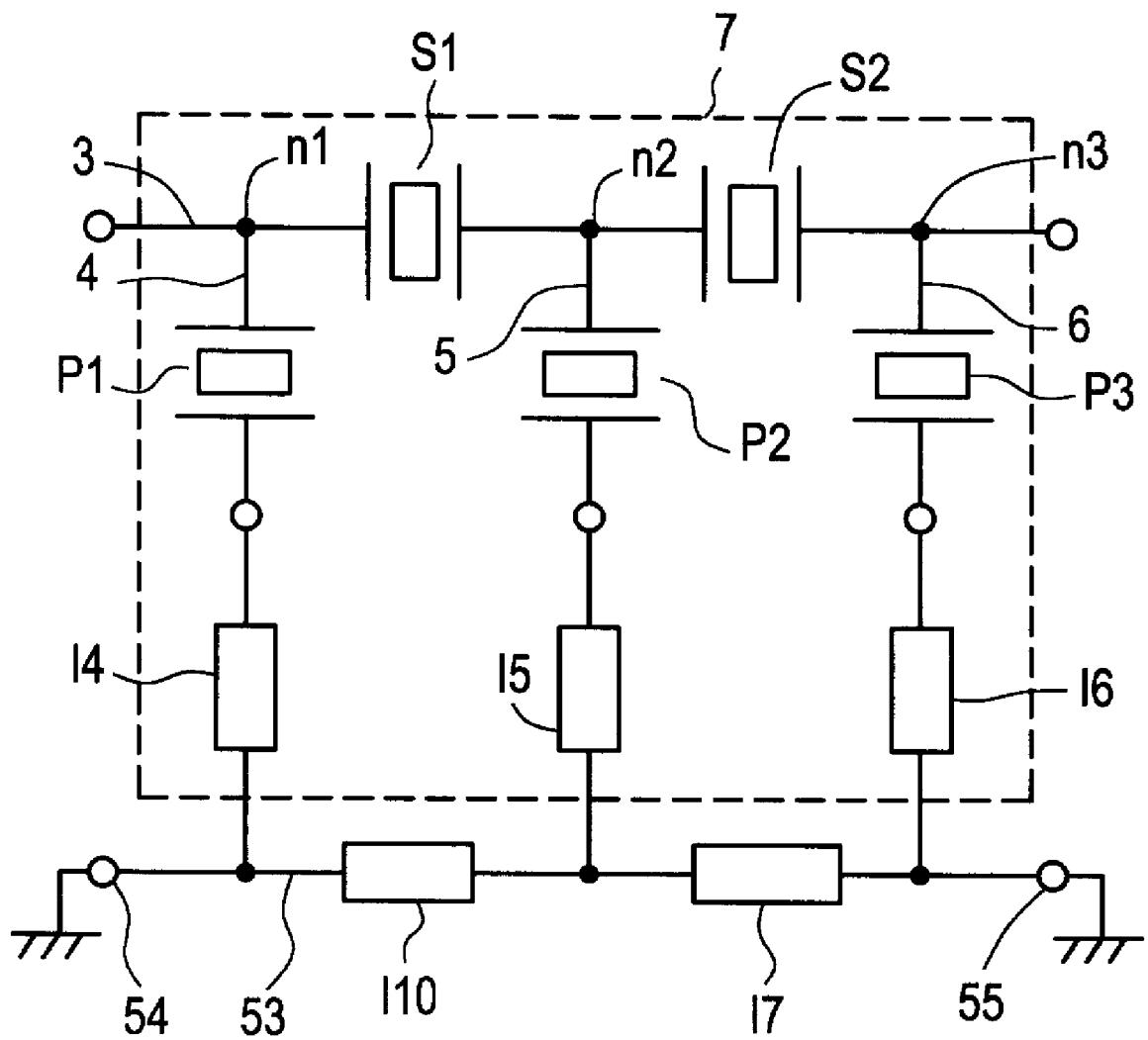
FIG. 8 is a circuit diagram of a surface acoustic wave filter of Comparative example 2.

Next, Comparative example 2 in which all electrodes to be connected to the ground potential of the first to third parallel arm resonators are separated within the package 7 will be considered. In this case, the equivalent circuit is as shown in FIG. 8. That is, in the package 7 of FIG. 8, all electrodes connected to the ground potential of the parallel arm resonators P1 to P3 are separated, and the electrodes extend to an exterior of the package 7 via impedances I4 to I6 of the package, respectively.

In FIG. 8, a line 53 is formed on a circuit substrate on which the surface acoustic wave filter is mounted, and the impedances I10 and I7 indicate impedances on the circuit substrate. Therefore, since the reference potential electrode of the third parallel arm resonator P2 is connected to the ground potential via the impedances I5, I6 and I7, the grounding electrode of the parallel arm resonator P2 is made to float when viewed from either of the grounding terminals 54 and 55 on the input and output sides.

Since the resonance resistance decreases at the resonance point of the parallel arm resonators, in the above-described construction, the magnitude of the impedance I5 on the package side and the magnitude of the impedances I10 and I7 on the circuit substrate side become considerable, causing the characteristics to vary greatly. As a result, as shown in FIG. 8, when all the reference potential electrodes of the parallel arm resonators P1 to P3 are separated within the package 7, the attenuation in the low frequencies of the pass band decreases.

Figure 9:
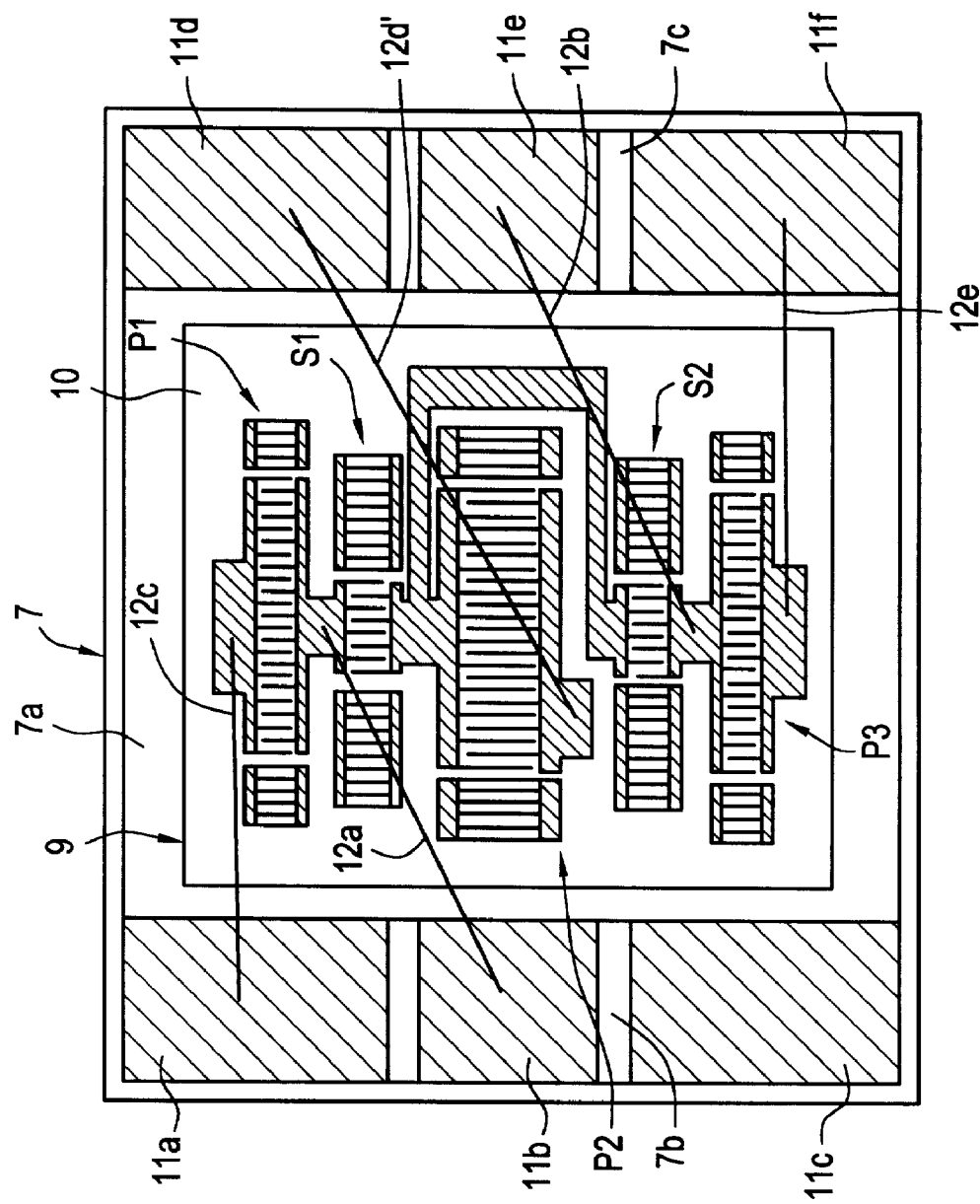
FIG. 9 is a plan view of the surface acoustic wave filter of Comparative example 2.

FIG. 9 is a plan view of the surface acoustic wave filter of the comparative example 2 having the circuit components shown in FIG. 8. Components in FIG. 9 which are the same as those of FIG. 2 are given the same reference numerals. As is clear from FIG. 9, electrodes to be connected with the ground potential of the parallel arm resonators P1 to P3 are electrically connected to the different electrode lands 11a, 11d and 11f by bonding wires 12c, 12d', and 12e, respectively.

Further, the electrode lands 11a to 11f are each extended onto the different external electrodes provided on the bottom surface of the package 7 in the same way as in the first preferred embodiment.

Next, the advantages of the first preferred embodiment will be clarified by showing the attenuation frequency characteristics of the first preferred embodiment and Comparative examples 1 and 2 on the basis of the specific experiment examples.

In the first preferred embodiment, for the piezoelectric substrate 10, a LiNbO$_3$ substrate of 64° Y cut X propagation is preferably used, and for the series arm resonators S1 and S2 and the parallel arm resonators P1 to P3, resonators made of Al are used, and attenuation frequency characteristics are measured. In Comparative example 1, as shown in FIG. 7, a filter is prepared in the same way as in the first preferred embodiment except that the conductive pattern 52 is provided in the package 7. In comparative example 2, as shown in FIG. 9, a filter is prepared in the same way as in the first preferred embodiment except that the grounding potential electrodes of the parallel arm resonators P1 to P3 are connected to the electrode lands 11a, 11d, and 11f by bonding wires. In each case, attenuation frequency characteristics are measured.

Figure 10:
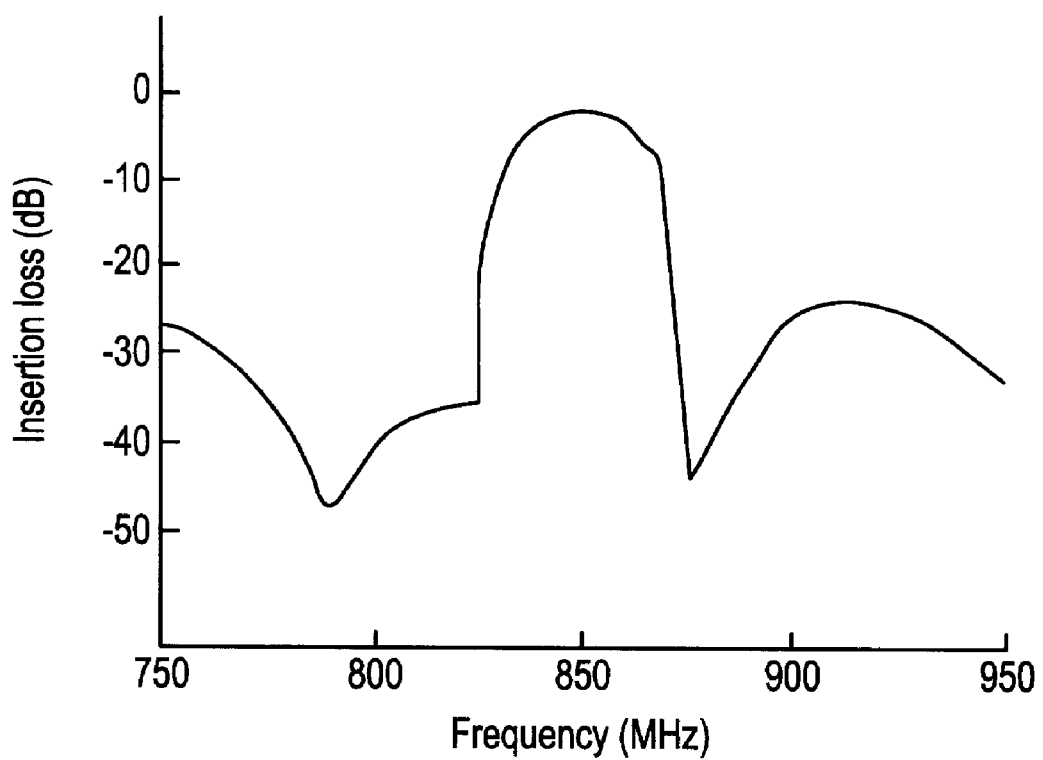
FIG. 10 shows the attenuation frequency characteristic of the surface acoustic wave filter of Comparative example 1.
Figure 11:
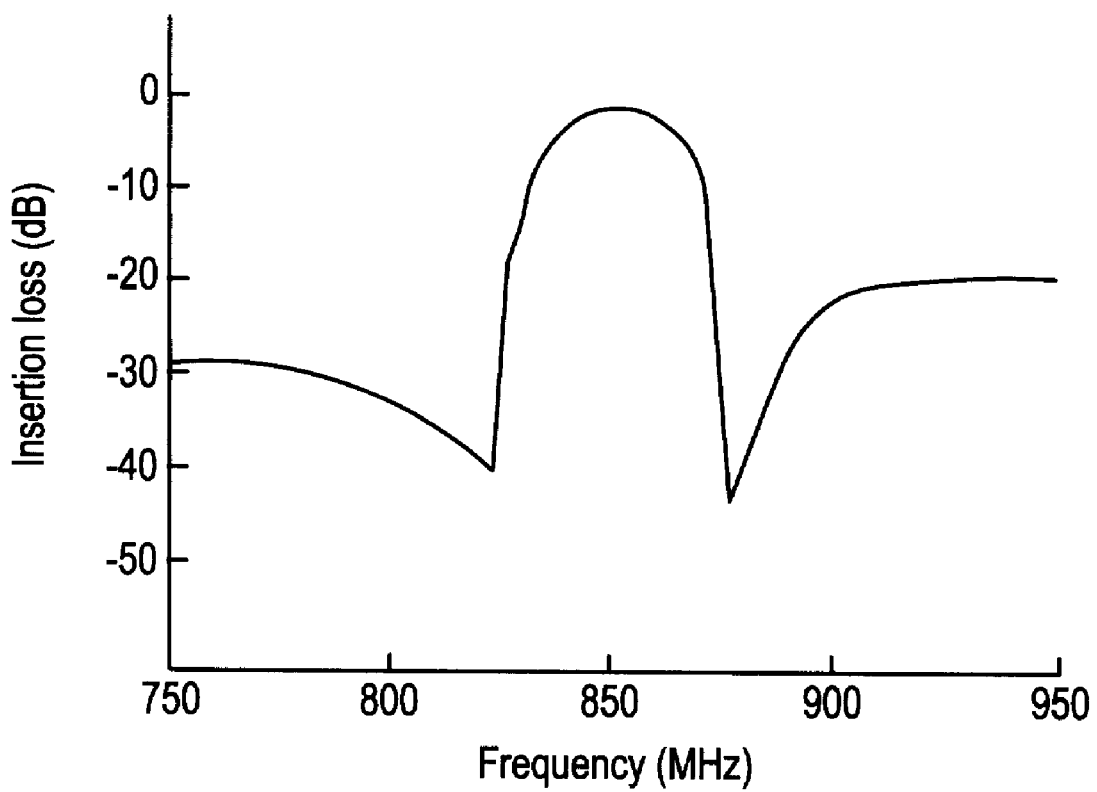
FIG. 11 shows the attenuation frequency characteristic of the surface acoustic wave filter of Comparative example 2.
Figure 12:
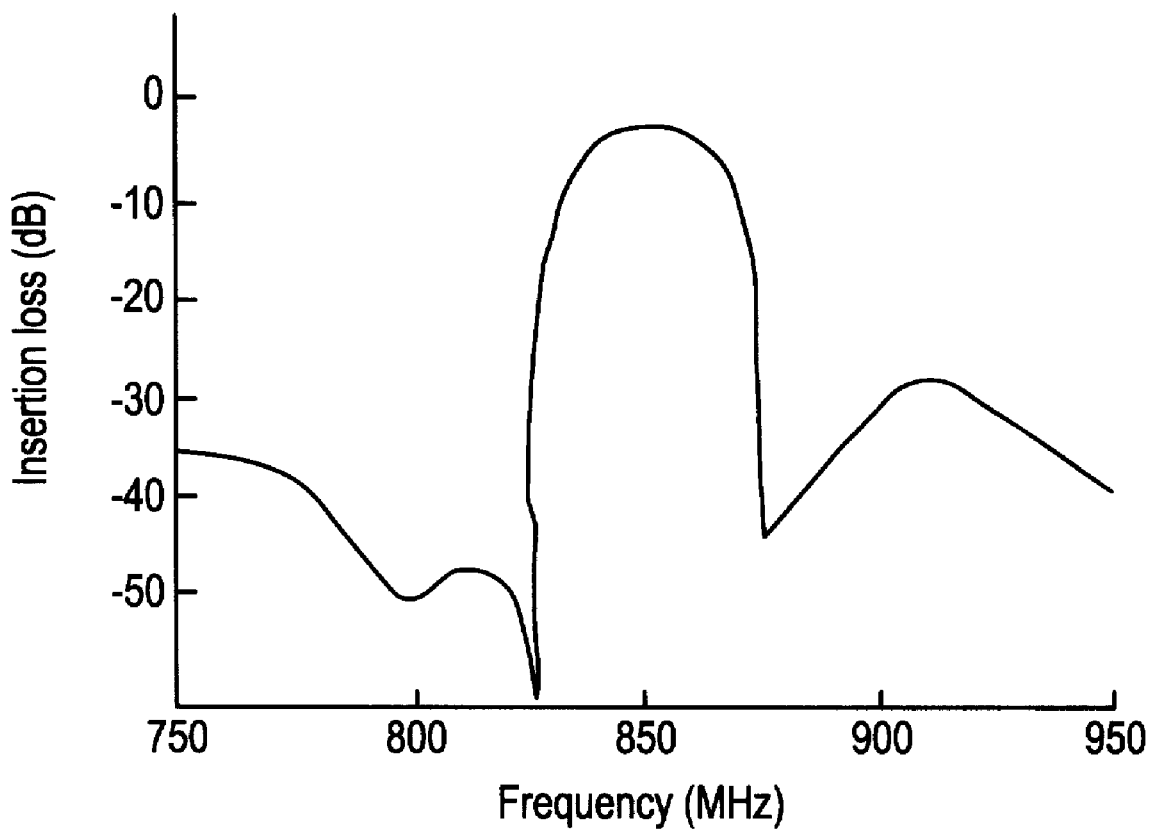
FIG. 12 shows the attenuation frequency characteristic of the surface acoustic wave filter of the first preferred embodiment.

FIG. 10 shows the attenuation frequency characteristics of Comparative example 1. FIG. 11 shows the attenuation frequency characteristics of Comparative example 2. FIG. 12 shows the attenuation frequency characteristics of the first preferred embodiment.

As is clear from a comparison between FIGS. 10 to 12, in the first preferred embodiment (the characteristics of FIG. 12), the attenuation in a region other than the pass band, in particular, the attenuation at the frequencies lower than the frequencies of the pass band, is improved. A comparison between FIGS. 10 to 12 shows that the attenuation amount in the low frequencies is improved by about 10 dB.

Figure 13:
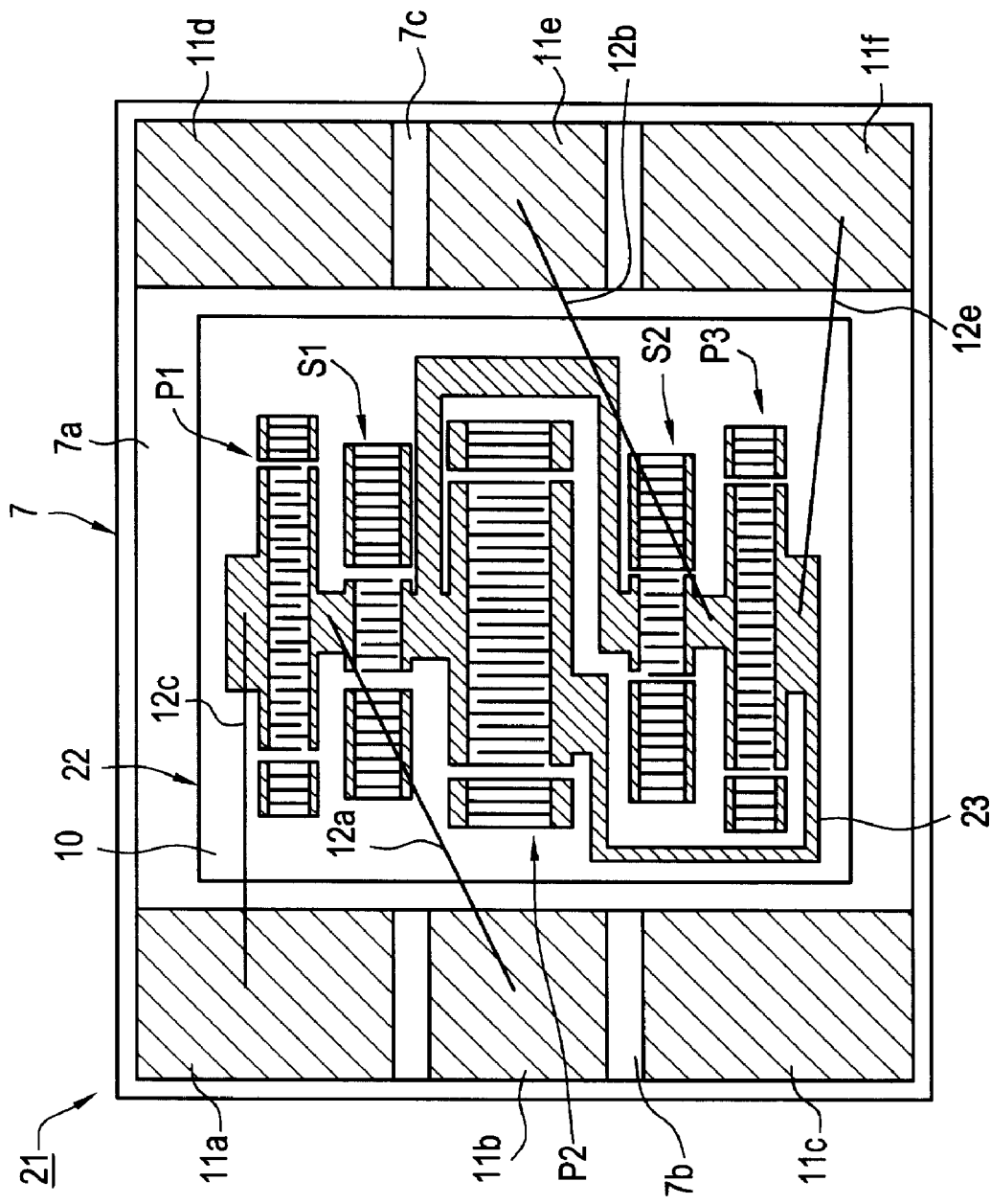
FIG. 13 is a plan view illustrating a surface acoustic wave filter according to a second preferred embodiment.

FIG. 13 illustrates a surface acoustic wave filter according to a second preferred embodiment of the present invention. In a surface acoustic wave filter 21, a surface acoustic wave filter element 22 having two series arm resonators S1 and S2 and three parallel arm resonators P1 to P3 is preferably provided.

The second preferred embodiment is different from the first preferred embodiment in that the wiring structure of the parallel arm resonators P1 to P3 connected to the ground potential is different. The components which are same as explained in the first preferred embodiment are indicated with the same reference numerals used in the first preferred embodiment.

In the second preferred embodiment, an electrode to be connected to the ground potential of the series arm resonator P1 is connected to the electrode land 11b by a bonding wire 12a. An electrode to be connected to the ground potential of the second parallel arm resonator P3 is electrically connected to the electrode land 11f by bonding wire 12e. An electrode to be connected to the ground potential of the parallel arm resonator P2 is electrically connected to the electrode which is connected to the ground potential of the second parallel arm resonator P3 by a conductive pattern 23. That is, in the first preferred embodiment shown in FIG. 2, although the electrode to be connected to the ground potential of the parallel arm resonator P2 is electrically connected to the electrode land 11f by a bonding wire 12d, in the second preferred embodiment, the electrode to be connected to the ground potential of the parallel arm resonator P2 is short-circuited with the electrode connected to the ground potential of the second parallel arm resonator P3 via the conductive pattern 23. Therefore, the bonding wire 12d shown in FIG. 2 is not used in the second preferred embodiment shown in FIG. 13.

Also in the second preferred embodiment, the equivalent circuit is as shown in FIG. 1. Therefore, in the same way as in the first preferred embodiment, the electrodes to be connected to the ground potential of the first and second parallel arm resonators are separated within the package 7, and the electrode connected to the ground potential of the parallel arm resonator P2 is short-circuited with the electrode connected to the ground potential of the second parallel arm resonator P3. This makes it possible to increase the attenuation in the frequency region lower than the pass band.

Figure 14:
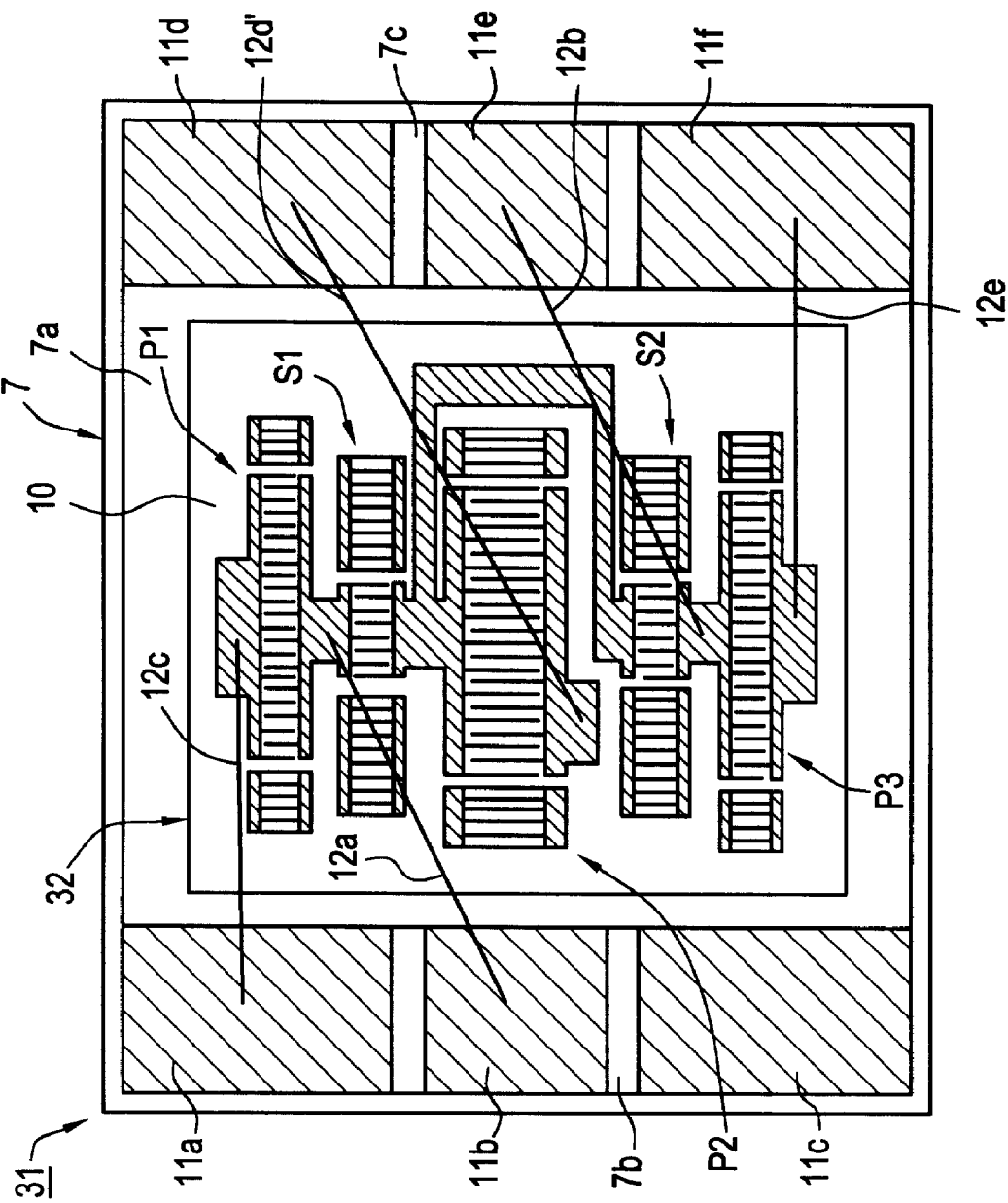
FIG. 14 is a plan view illustrating a surface acoustic wave filter according to a third preferred embodiment.

FIG. 14 is a plan view illustrating a surface acoustic wave filter according to a third preferred embodiment of the present invention. A surface acoustic wave filter 31 includes a surface acoustic wave filter element 32 and a package 7 to hold the surface acoustic wave filter element 32. The surface acoustic wave filter element 32 has the series arm resonators S1 and S2 and the parallel arm resonators P1 to P3, which are constructed in the same manner as the surface acoustic wave filter element 9 of the first preferred embodiment.

The third preferred embodiment is different from the first preferred embodiment in that the electrode of the parallel arm resonator P2 to be connected to the ground potential is electrically connected to the electrode land 11d by bonding wire 12d', and the electrode land 11d and the electrode land 11f are short-circuited with each other within the package 7 by a conductive pattern (which will be described later).

Figure 15:
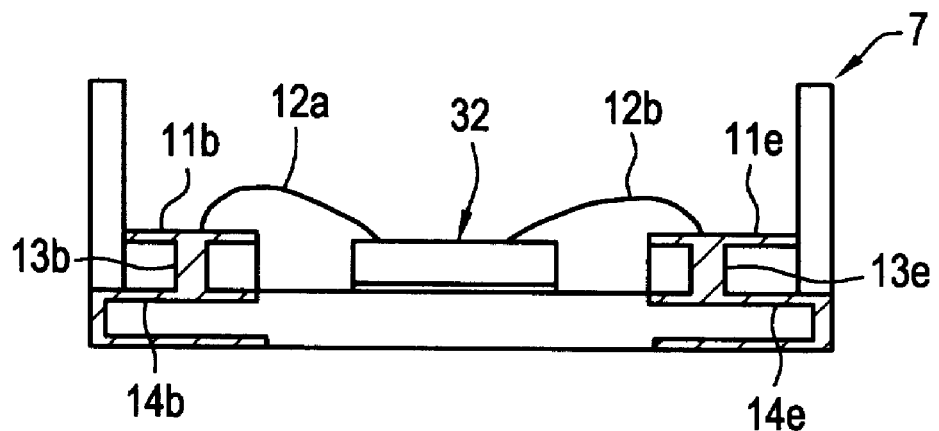
FIG. 15 is a cross-sectional view of the surface acoustic wave filter according to the third preferred embodiment.

FIG. 15 is a cross-sectional view of the surface acoustic wave filter 31. Electrode lands 11b and 11e are electrically connected with the external electrodes 14b and 14e via through holes 13b and 13e, respectively. The external electrodes 14b and 14e extend onto the bottom surface of the package 7.

Figure 16:
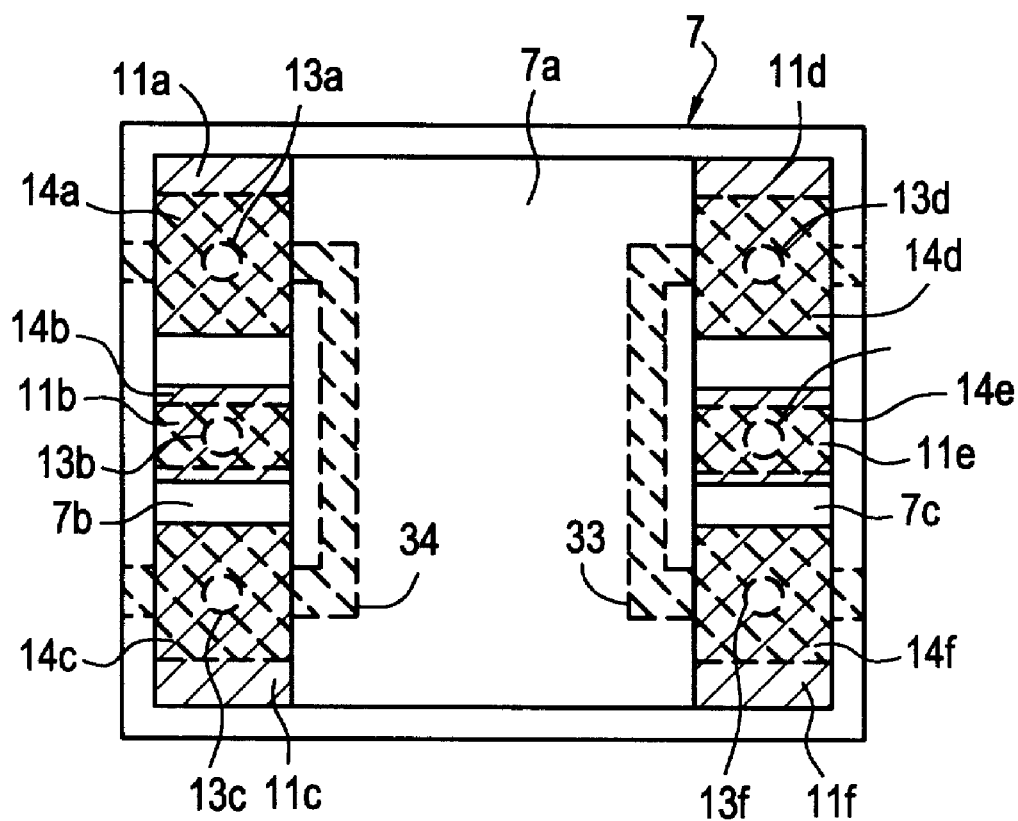
FIG. 16 is a plan view illustrating external electrodes within a package of the surface acoustic wave filter according to the third preferred embodiment.

FIG. 16 is a plan view illustrating the configuration of electrodes lands 13a to 13f provided on the step sections 7b and 7c and external electrodes 14a to 14f provided under the step sections 7b and 7c. The electrode lands 11a to 11f are illustrated with solid hatching lines in FIG. 16 while the external electrodes 14a to 14f are shown with dotted hatching lines. The electrode lands 13a to 13f are electrically connected with the external electrodes 14a to 14f via the through holes 13a to 13f, respectively. Moreover, the external electrodes 14a and 14d are electrically connected with electrodes 14c and 14f by conductive patterns 34 and 33, respectively.

Therefore, the electrode to be connected to the ground potential of the parallel arm resonator P3 is connected to the electrode land 11d, which is different from the electrode land 11f, via the bonding wire 12d. Since the electrode land 11d is electrically connected to the electrode land 11f by the conductive pattern 33, the electrode of the parallel arm resonator P3 to be connected to the grounding electrode is short-circuited with the electrode land 11f connected to the electrode of the parallel arm resonator P2 to be connected to the ground potential within the package 7. Thus, in the surface acoustic wave filter 31 of the third preferred embodiment, it is also possible to significantly improve the attenuation in the frequency region lower than the pass band in the same way as in the first preferred embodiment.

Figure 17:
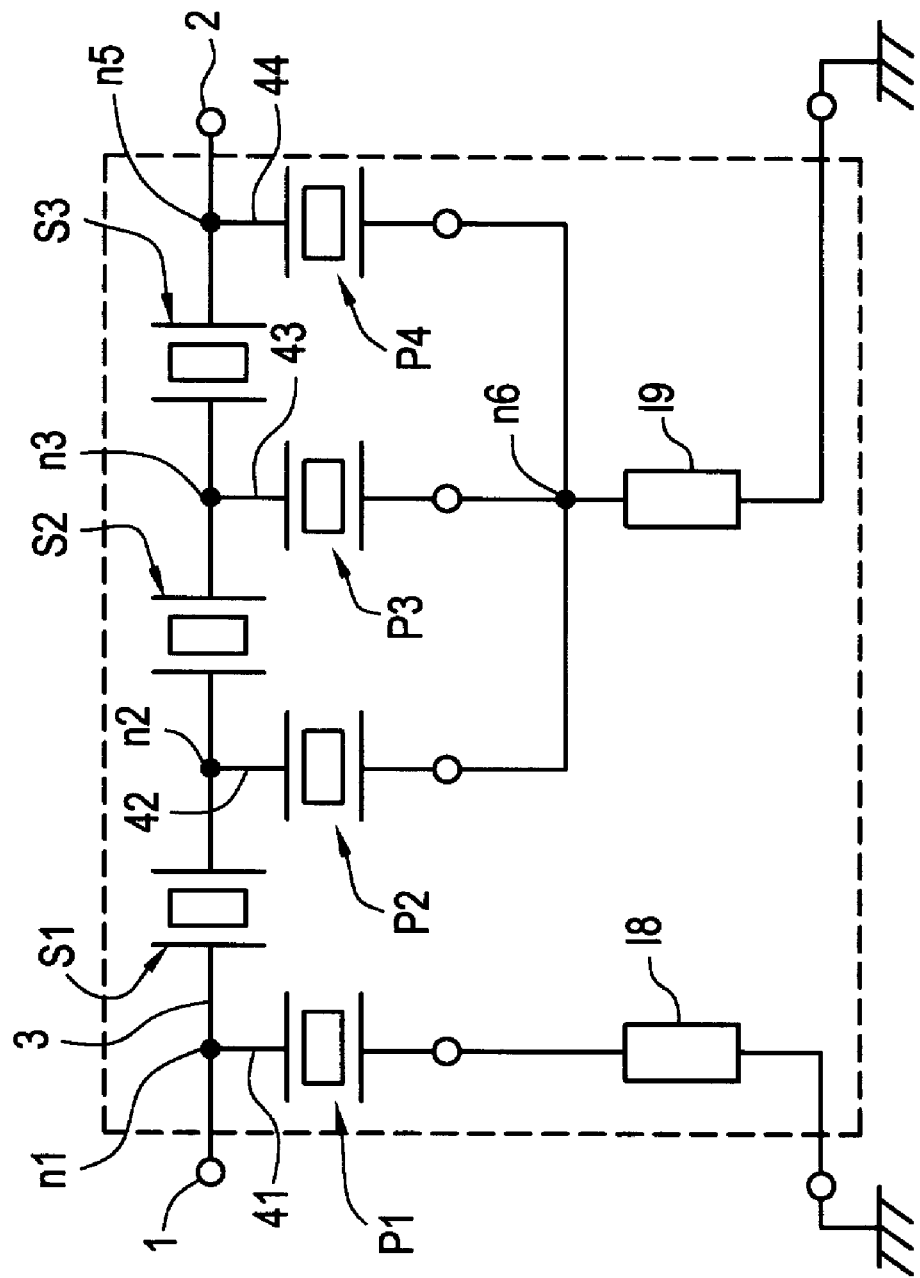
FIG. 17 is a circuit diagram illustrating a surface acoustic wave filter according to a fourth preferred embodiment of the present invention.
Figure 18:
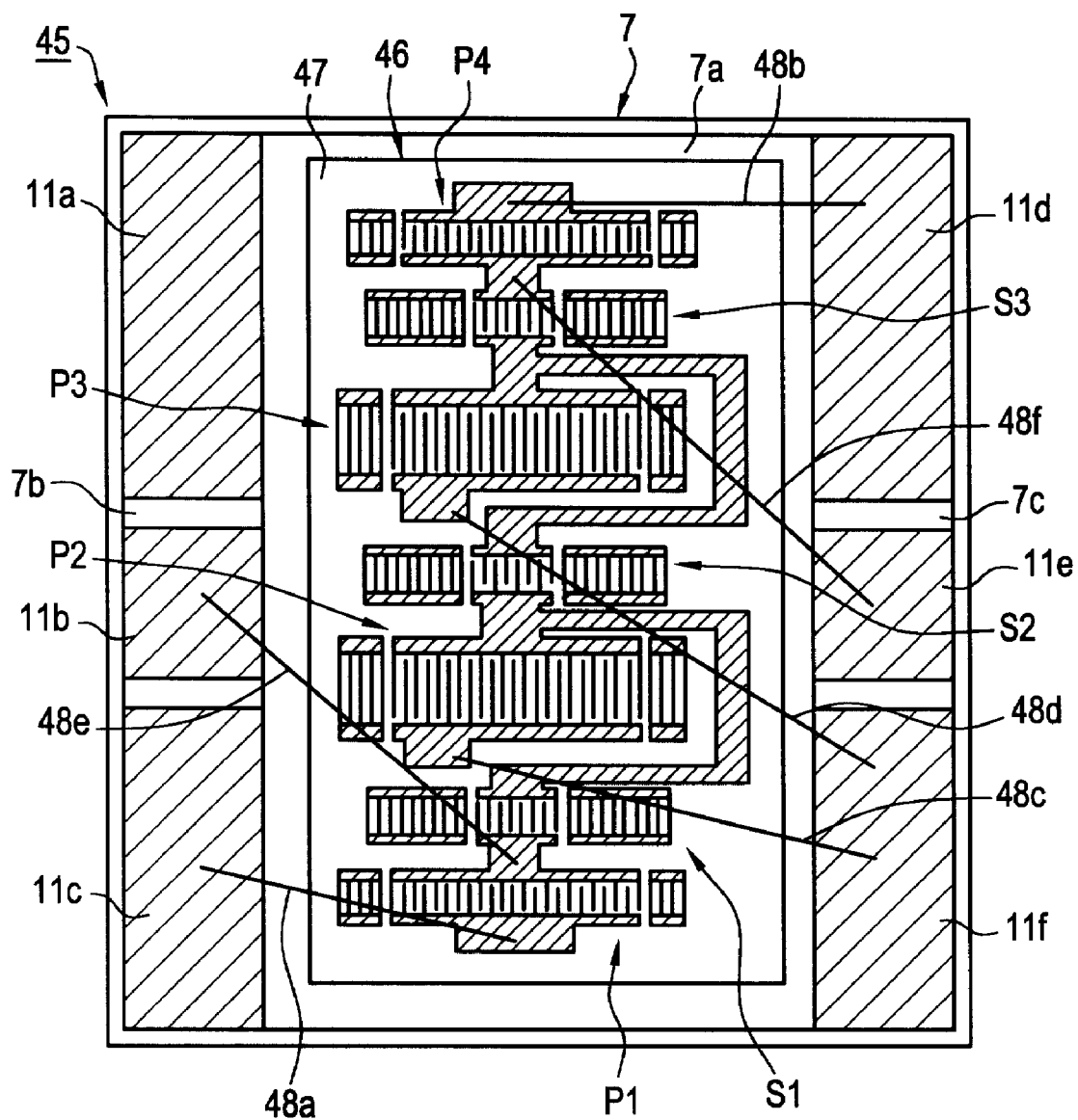
FIG. 18 is a plan view illustrating the surface acoustic wave filter according to the fourth preferred embodiment.

FIG. 17 shows an equivalent circuit of a surface acoustic wave filter according to a fourth preferred embodiment of the present invention. FIG. 18 shows a plan view of the surface acoustic wave filter.

As is indicated in FIG. 17, the surface acoustic wave filter according to the fourth preferred embodiment has three series arm resonators S1, S2, and S3 inserted into the series arm 3. Further, four parallel arms 41 to 44 formed between connection points n1, n2, n3, and n5 and a ground potential, respectively, and parallel arm resonators P1 to P4 are inserted into each of the parallel arms 41 to 44. Therefore, the three series arm resonators S1, S2, and S3 and the four parallel arms resonators P1 to P4 are used to define a ladder-type circuit.

The parallel arm resonator P1 is connected to the connection point ni between the input terminal 1 and the series arm resonator S1 proximate to the input terminal 1, the parallel arm resonator P1 forms a first parallel arm resonator. In a similar manner, the parallel arm resonator P4 connected to the connection point n5 of the output terminal 2 and the series arm resonator S3 proximate to the output terminal 2 forms a second parallel arm resonator in this preferred embodiment of the present invention. The parallel arm resonators P2 and P3 are parallel arm resonators which are neither the first nor second parallel arm resonator. In FIG. 17, I8 and I9 each indicate an impedance of the package.

As is clear from FIG. 17, also in this preferred embodiment, the first parallel arm resonator P1 and the second parallel arm resonator P4 are separated in the package 7 so as to be connected to the ground potential through different paths. On the other hand, the parallel arm resonators P2 and P3 which are neither the first nor second parallel arm resonator are connected in common to the second parallel arm resonator P4 via a connection point n6, and connected to the ground potential via the impedance I9.

Therefore, in the same manner as in the first preferred embodiment, since leakage of signals from the input side to the output side is not likely to occur and all the electrodes connected to the reference potential of the parallel arm resonator are not connected commonly, it is possible to significantly improve the attenuation in the frequency region lower than the pass band.

FIG. 18 is a plan view illustrating the construction of a surface acoustic wave filter according to a fourth preferred embodiment. Also in a surface acoustic wave filter 45, the package 7 is formed in the same way as the package 7 used in the first preferred embodiment. In a surface acoustic wave filter element 46, three series arm resonators S1 to S3 and four parallel arm resonators P1 to P4 are provided on a piezoelectric substrate 47. For the materials that form the piezoelectric substrate and each resonator, the same materials as those of the first preferred embodiment may be used.

In the surface acoustic wave filter element 46, the parallel arm resonators P1 to P4 are disposed upwards from the bottom. That is, the electrode to be connected to the ground potential in the first parallel arm resonator P1 is electrically connected to the electrode land 11c by bonding wire 48a. The electrode to be connected to the ground potential in the second parallel arm resonator P4 is electrically connected to the electrode land 11d by bonding wire 48b. The electrodes to be connected to the ground potential of the parallel arm resonators P2 and P3 are electrically connected to the electrode land 11f by bonding wires 48c and 48d, respectively.

One electrode of the series arm resonator S1 is wired to the electrode land 11b which is connected to the input terminal by bonding wire 48e. One electrode of the series arm resonator S3 is wired to the electrode land 11e by bonding wire 48f.

On the other hand, the electrode lands 11d and 11f are short-circuited with each other by a conductive pattern (not shown) within the package 7 in the same manner as in the construction shown in FIG. 16. Therefore, the electrode to be connected to the ground potential in the parallel arm resonators P2 and P3 is connected to the electrode land which is different from the electrode to be connected to the ground potential in the second parallel arm resonator P4, but the electrode land 11f to which the electrode to be connected to the ground potential in the parallel arm resonators P2 and P3 is connected is short-circuited with the electrode land 11d to which the electrode to be connected to the ground potential in the second parallel arm resonator P4 is connected within the package 7.

A method in which the electrodes to be connected to the ground potential in the first and second parallel arm resonators are separated and the electrode to be connected to the ground potential in the parallel arm resonator which is neither the first nor second parallel arm resonator is short-circuited with the electrode connected to the ground potential of the first or second parallel arm resonator within the package in the present invention is not limited to the above-described first to fourth preferred embodiments, and can be modified as long as the above-described conditions are met.

Figure 19:
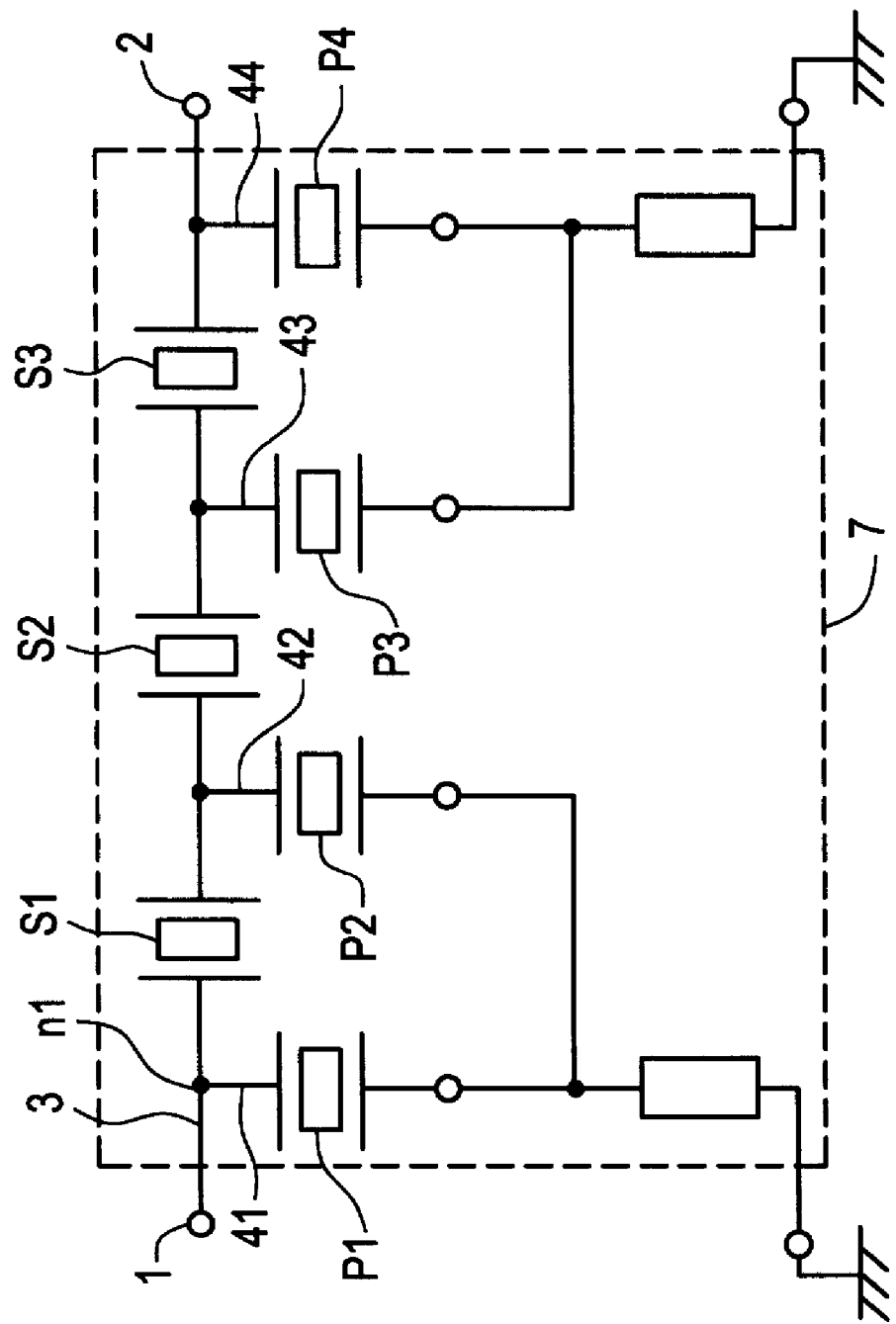
FIG. 19 is a circuit diagram illustrating a modification of the surface acoustic wave filter of the preferred embodiments of the present invention.

For example, as shown in FIG. 19, in the case where a ladder-type circuit of 3.5 steps is formed in the same way as in the fourth preferred embodiment, the parallel arm resonator P2 may be connected commonly to the first parallel arm resonator P1 in the package, and the parallel arm resonator P3 may be connected commonly to the second parallel arm resonator P4 in the package so that the connected portions are then electrically connected to the outer side of the package.

Figure 20:
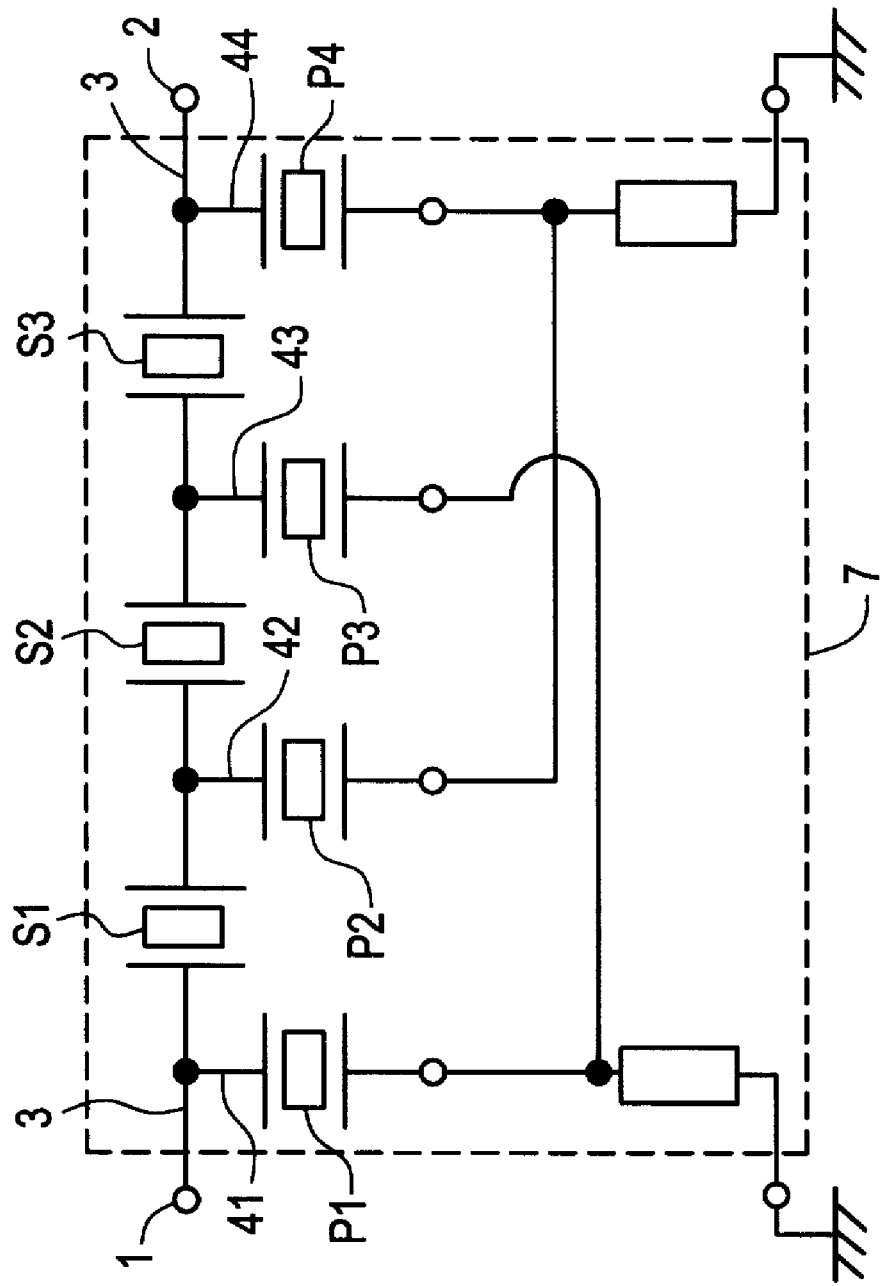
FIG. 20 is a circuit diagram illustrating another modification of the surface acoustic wave filter of the preferred embodiments of the present invention.
Figure 21:
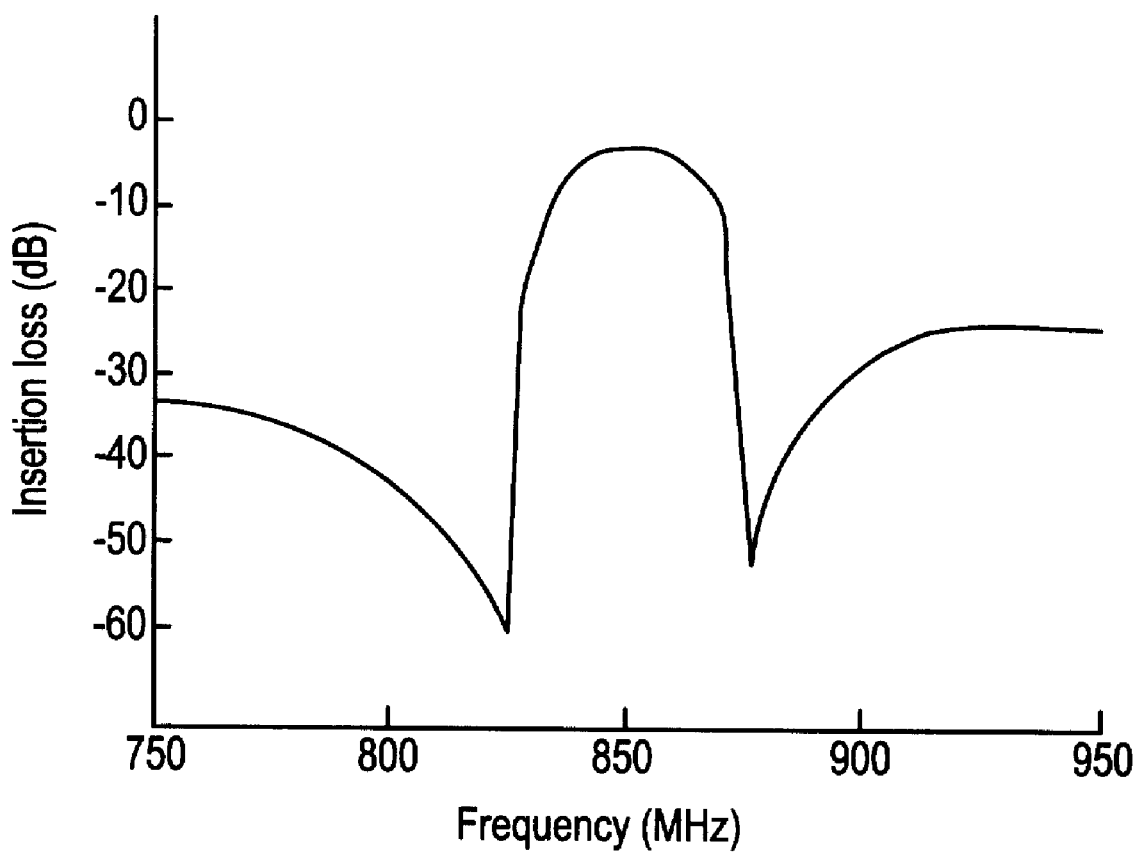
FIG. 21 shows the attenuation frequency characteristic of a conventional surface acoustic wave filter.
Figure 22:
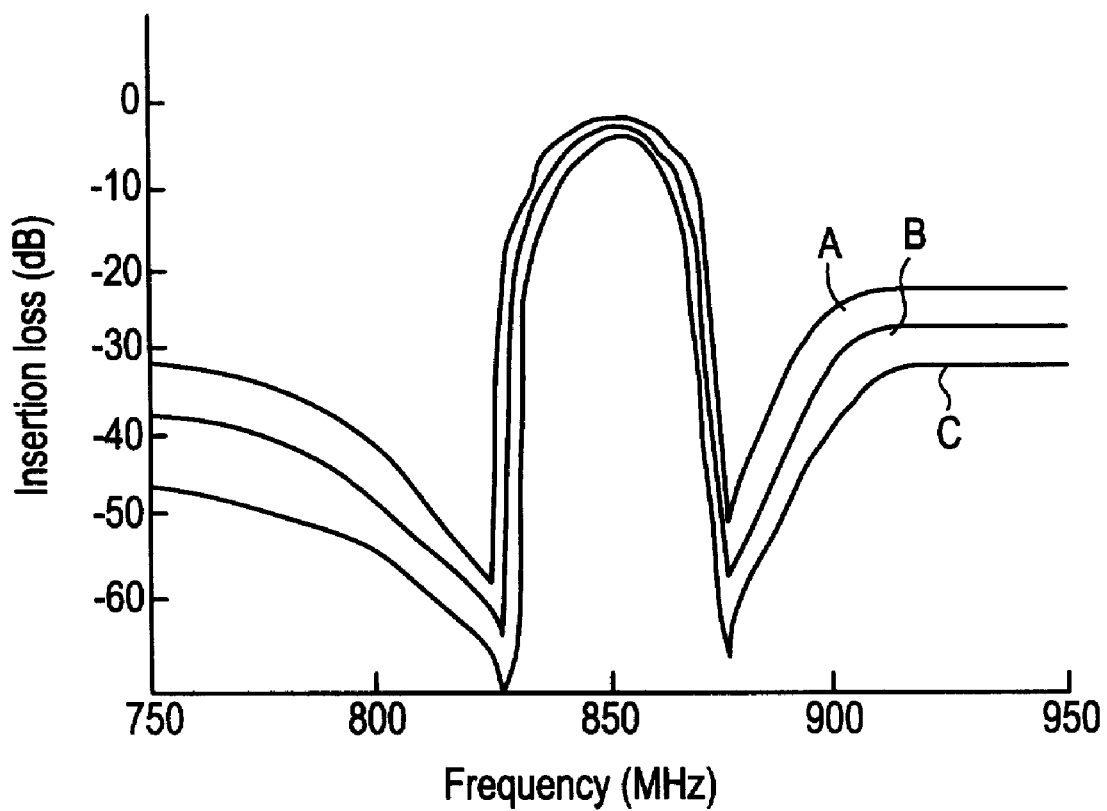
FIG. 22 shows variations of the attenuation frequency characteristic when the capacitance ratio of a parallel arm resonator to a series arm resonator is varied in the conventional surface acoustic wave filter.

Further, as shown in FIG. 20, the parallel arm resonators P2 and the second parallel arm resonator P4 may be connected commonly in the package and the parallel arm resonator P3 may be connected commonly to the first parallel arm resonator P1 in the package so that the connected potions are electrically connected to the outer side of the package.

As described above, in the surface acoustic wave filter according to the preferred embodiments of the present invention, the electrodes to be connected to the reference potential in the first and second parallel arm resonators, respectively, are electrically connected to different electrode lands, that is, first and second electrode lands, disposed in a package, and the electrode to be connected to the reference potential in the parallel arm resonator which is neither the first nor second parallel arm resonator is short-circuited with the first or second electrode land within the package. Therefore, a decrease in the attenuation amount due to a signal leakage from the input side to the output side does not occur, and a decrease in the attenuation due to the influence of impedance on a substrate on which the surface acoustic wave filter is mounted does not occur. Thus, it is possible to significantly increase the attenuation near the pass band, in particular, the attenuation in the frequency region lower than the pass band. Further, the insertion loss within the pass band is not increased.

Therefore, since the attenuation amount in the frequency region near the pass band is increased effectively without increasing the insertion loss, it becomes possible to provide a band filter having excellent transmission characteristics.

In the surface acoustic wave filter according to the preferred embodiments of the present invention, an increase in the attenuation outside the pass band can be achieved by implementing a novel method of connecting electrodes connected to the reference potential of the parallel arm resonator within a package as described above. Therefore, various modifications are possible, and it is possible to easily realize a connection construction with the reference potential of the first and second parallel arm resonators and the parallel arm resonator which is neither the first nor second parallel arm resonator according to the construction of the surface acoustic wave filter element to be used and the dimensions of the package.

For example, it is possible to easily short-circuit the parallel arm resonator which is neither the first nor second parallel arm resonator with the electrode to be connected to the reference potential in the first or second parallel arm resonator by connecting the electrode to be connected to the reference potential in the parallel arm resonator which is neither the first nor second parallel arm resonator with the first or second electrode land by a bonding wire.

Further, the electrode to be connected to the reference potential in the parallel arm resonator which is neither the first nor second parallel arm resonator is short-circuited with the electrode to be connected to the reference potential of the first or second parallel arm resonator. Therefore, it is possible to increase the attenuation amount outside the pass band without causing a bonding operation to be complicated after a surface acoustic wave filter element is obtained.

In addition, since electrode lands to be connected to the reference potential in the parallel arm resonator which is neither the first nor second parallel arm resonator are short-circuited with the first or second electrode land within a package, it is possible to increase the attenuation amount outside the pass band.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave filter comprising:

a piezoelectric substrate;

a surface acoustic wave filter element including series arm resonators and parallel arm resonators arranged on said piezoelectric substrate so as to define a ladder-type circuit which has a series arm having input and output terminals and a plurality of parallel arms located between the series arm and a reference potential;

a package for holding the surface acoustic wave filter element therein and having a plurality of electrode lands electrically connected to the surface acoustic wave filter element; and a plurality of connecting members by which the input and output terminals and a reference potential terminal of the surface acoustic wave filter element are electrically connected to the plurality of electrode lands of the package, respectively; wherein a first one of the parallel arm resonators is connected between the reference potential and a connection point between the input terminal and one of the series arm resonators which is closest to the input terminal, and a second one of the parallel arm resonators is connected between the reference potential and a connection point between the output terminal and one of the series arm resonators which is closest to the output terminal, and wherein reference potential electrodes of the first and second parallel arm resonators are connected to first and second of the electrode lands which are disposed in the package and which are electrically insulated from each other, respectively, and a reference potential electrode of another one of the parallel arm resonators is short-circuited with the reference potential electrode of the first or second parallel arm resonator within the package.

2. A surface acoustic wave filter according to claim 1, wherein the plurality of connecting members comprise bonding wires.

3. A surface acoustic wave filter according to claim 1, wherein the reference potential electrode of the parallel arm resonator, which is neither the first parallel arm resonator nor the second parallel arm resonator, is electrically connected to said first electrode land or said second electrode land to which the reference potential electrode of the first parallel arm resonator or the second parallel arm resonator is electrically connected.

4. A surface acoustic wave filter according to claim 1, wherein the reference potential electrode of the parallel arm resonator, which is neither the first parallel arm resonator nor the second parallel arm resonator, is electrically short-circuited with the reference potential electrode of the first parallel arm resonator or the second parallel arm resonator on the piezoelectric substrate.

5. A surface acoustic wave filter according to claim 1, wherein the reference potential electrode of the parallel arm resonator, which is neither the first parallel arm resonator nor the second parallel arm resonator, is electrically connected to the first electrode land or the second electrode land which is short-circuited within the package.

6. A surface acoustic wave filter comprising:

a piezoelectric substrate;

a surface acoustic wave filter element including a plurality of series arm resonators and first, second and third parallel arm resonators each arranged on said piezoelectric substrate, the plurality of series arm resonators being connected in series with each other so as to define a series arm having input and output terminals of a ladder-type circuit, each of the first, second and third parallel arm resonators having a second electrode to be connected with a reference potential and first electrode being connected with the series arm so as to form a parallel arm of the ladder-type circuit, respectively, the first and second parallel arm resonators being closest to the input terminal and the output terminal, respectively; and a package for holding the surface acoustic wave filter element, the package having first and second electrode lands which are electrically isolated from each other and electrically connected with the second electrodes of the first and second parallel arm resonators, respectively, the second electrode of the third parallel arm resonator being short-circuited with the second electrode of one of the first parallel arm resonator and the second parallel arm resonator within the package.

7. A surface acoustic wave filter according to claim 6, further comprising a bonding wire, wherein the second electrode of the third parallel arm resonator is short-circuited with one of the first electrode land or the second electrode land by said bonding wire.

8. A surface acoustic wave filter according to claim 6, further comprising an electrode pattern disposed on the piezoelectric substrate, wherein the second electrode of the third parallel arm resonator is short-circuited with the second electrode of one of the first parallel arm resonator and the second parallel arm resonator by said electrode pattern.

9. A surface acoustic wave filter according to claim 6, wherein the package has a third electrode land which is short-circuited to one of the first and second electrode lands within the package, and the second electrode of the third parallel arm resonator is electrically connected with the third electrode land.

10. A surface acoustic wave filter according to claim 6, wherein each of the plurality of series arm resonators and the first, second and third parallel arm resonators comprises a one port type SAW resonator.

* * * * *